(12) United States Patent
Wang

(10) Patent No.: US 7,875,505 B2
(45) Date of Patent: Jan. 25, 2011

(54) MULTI-DIE SEMICONDUCTOR PACKAGE STRUCTURE AND METHOD FOR MANUFACTURING THE SAME

(75) Inventor: Tsing-Chow Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 368 days.

(21) Appl. No.: 11/942,174

(22) Filed: Nov. 19, 2007

(65) Prior Publication Data
US 2008/0157308 A1    Jul. 3, 2008

(30) Foreign Application Priority Data
Dec. 28, 2006    (CN) .......................... 2006 1 0148239

(51) Int. Cl.
  *H01L 21/00*    (2006.01)
(52) U.S. Cl. .................. 438/123; 257/666; 257/686
(58) Field of Classification Search .......... 257/666–677
See application file for complete search history.

(56) References Cited

U.S. PATENT DOCUMENTS

| 6,271,581 B2 * | 8/2001 | Huang et al. ................. 257/666 |
| 6,316,727 B1 | 11/2001 | Liu |

* cited by examiner

*Primary Examiner*—Leonardo Andújar
(74) *Attorney, Agent, or Firm*—Squire, Sanders & Dempsey, L.L.P.

(57) ABSTRACT

The present invention provides a multi-die semiconductor package structure and a manufacturing method thereof, which includes providing at least two dies and a lead frame including a die pad and a lead wire located at the periphery of the die pad, the die pad has a via hole at the edge thereof, binding a base opposite side of a first die to the die pad; electrically connecting the first die to the lead wire through the via hole; binding a base side of a second die to the die pad, the first and second dies are disposed on the opposite sides of the die pad respectively; electrically connecting the second die to the lead wire; stacking other dies above the first or second die and electrically connecting them to the lead wire; and encapsulating said at least two dies and the lead frame to form a package.

7 Claims, 6 Drawing Sheets

MULTI-DIE SEMICONDUCTOR PACKAGE STRUCTURE AND METHOD FOR MANUFACTURING THE SAME

CROSS-REFERENCE TO RELATED APPLICATION

This application claims the benefit of Chinese Patent Application No. 200610148239.9, filed on Dec. 28, 2006, the entire disclosure of which is incorporated herein by reference.

FIELD OF THE INVENTION

The present invention relates to a multi-die semiconductor packaging structure and a method for manufacturing the same, and more particularly, to a semiconductor packaging structure and a method for manufacturing the same in which a plurality of dies are interconnected through a lead frame.

BACKGROUND OF THE INVENTION

The package density of a semiconductor is continuously increased due to the increasing requirements for the miniaturization, light-weight and multifunction of electronic elements. Therefore, the package size and the area occupied by dies during packaging are desired to be reduced. In the technologies developed to satisfy the requirements mentioned above, the multi-die semiconductor packaging technology has a far-reaching contribution to the whole costs, efficiency and reliability of the packaged chips.

FIG. 1A to FIG. 1C illustrates a conventional method for manufacturing a multi-die package, as described in U.S. Pat. No. 6,674,173. As shown in FIG. 1A, a first die 100 with a plurality of first bond pads 106 disposed thereon is mounted faceup on a side of a die pad 104 of a lead frame 102, wherein the side of the first die 100 provided with the first bond pads 106 is a first substrate opposite side and the side opposite to the first substrate opposite side is a first substrate side. The first substrate side of the first die 100 is bound to the die pad 104 through a first binder layer 105. And the first bond pads 106 are electrically connected to lead wires 103 of the lead frame 102 respectively by using a plurality of first bond wires 108. Next, as shown in FIG. 1B, a second die 110 provided with a second bond pad 114 thereon is mounted facedown on another side of the die pad 104, wherein the side of the second die 110 provided with the first bond pad 106 thereon is the second base opposite side and the side opposite to the second base opposite side is the second base side. The second base side of the second die 110 is bound to the die pad 104 through a second binder layer 112. The second bond pad 114 is electrically connected to the lead wire 103 of the lead frame 102 by using a second bond wire 116. Since the second die 110 which is the same die type as the first die 100 has been mounted facedown, the internal wirings within the first die 100 and the second die 110 are asymmetrical. Accordingly, it is necessary to perform rewiring on the second die 110 so that the locations of the second bond pad 114 on the second die 110 are mirror symmetrical with the locations of the first bond pad 106 on the first die 100.

Finally, as shown in FIG. 1C, the first die 100, the second die 110 and the lead frame 102 are encapsulated by package paste 118 to form a package, in which only a portion of the lead wires 103 of the lead frame 102 are exposed.

In the prior art, the dies are bound on both sides of the lead frame in a pattern of single layer structure to form a multi-die semiconductor package. Since the dies on both sides of the lead frame are of the same die type mounted in different directions, the internal wirings within the dies disposed on both sides are asymmetrical. Accordingly, it is necessary that the die on one side is subjected to a further wiring process to form mirror symmetrical bond pads on the dies on both sides, which increases the complexity of the chip package process and thereby increases the costs.

SUMMARY OF THE INVENTION

Accordingly, the present invention addresses the above problems and provides a multi-die semiconductor package structure and a method for manufacturing the same, which can simplify the package process and avoid difficulties for the universal application.

In one aspect, the present invention provides a multi-die semiconductor package structure comprising a lead frame comprising a die pad and a lead wire located at the periphery of the die pad; and at least two dies; wherein a first die and a second die are disposed on the opposite sides of the die pad respectively, other dies are stacked above the first die or the second die, and a base side of the second die is bound to the die pad; the die pad has a via hole at the edge thereof; a base opposite side of the first die is bound to the die pad; and the first die is electrically connected to the lead wire through the via hole.

The side towards the lead wire of the via hole is closed (hereinafter this via hole is referred to "closed via hole"), or is opened (hereinafter this via hole is referred to "opened via hole").

The first die is electrically connected to the lead wire by a bond wire passing through the via hole, and the bond wire is made of gold, copper, aluminum, or copper-aluminum alloy.

The shape of the via hole is a regular or irregular polygon; and the edge of the polygon is a straight line, arc, or the combination thereof.

The base opposite side of the first die and the base side of the second die are bound to the die pad by using an insulated spacer film.

The insulated spacer film is made of an organic compound which preferably is an epoxy resin or a polyimide.

The lead frame is made of copper, nickel, aluminum, or a metal alloy containing at least two of copper, nickel and aluminum.

In another aspect, the present invention provides a method for packaging a multi-die semiconductor, which comprises providing at least two dies and a lead frame comprising a die pad and a lead wire located at the periphery of the die pad, the die pad has a via hole at the edge thereof; binding a base opposite side of a first die to the die pad; electrically connecting the first die to the lead wire through the via hole; binding a base side of a second die to the die pad, the first and second dies are disposed on the opposite sides of the die pad respectively; electrically connecting the second die to the lead wire; stacking other dies above the first or second die and electrically connecting them to the lead wire; and encapsulating said at least two dies and the lead frame to form a package.

The via hole is a closed via hole, or is an opened via hole.

The first die is electrically connected to the lead wire by a bond wire passing through the via hole.

The shape of the via hole is a regular or irregular polygon; and the edge of the polygon is a straight line, arc, or the combination thereof.

The base opposite side of the first die and the base side of the second die are bound to the die pad by using an insulated spacer film.

The lead frame is made of copper, nickel, aluminum, or a metal alloy containing at least two of copper, nickel and aluminum.

In comparison with the prior art, the present invention is advantageous in that the base opposite side of the first die is bound to the die pad and electrically connected to the lead wire through the via hole; the base side of the second die is bound to the die pad; and the first and second dies are disposed on the opposite sides of the die pad respectively. Since both the first and second die are the same die type and mounted faceup, the internal wirings within both dies are symmetrical and the bond pads on the first and second die are mirror symmetrical. Thereby it is not necessary to be subjected to a rewiring process. Therefore, it can simplify the multi-die package process, increase the density of package circuits, reduce the manufacture costs and enhance the performance of the circuits operation.

DESCRIPTION OF SPECIFIC EMBODIMENTS

In the prior art, the dies are bound on both sides of the lead frame in a pattern of single layer structure to form a multi-die semiconductor package structure. Although the dies on both sides of the lead frame are the same die type, they are mounted in different directions, thus the internal wiring within the dies located on both sides are asymmetrical. Accordingly, it is necessary that the die on one side is subjected to a further wiring process to form the mirror symmetrical bond pads on the dies on both sides of lead frame, which increases the complexity of the chip package process and thereby increases the costs.

In the present invention, the base opposite side of the first die is bound to the die pad and electrically connected to lead wire through the via hole; the base side of the second die is bound to the die pad; and the first and second dies are disposed on the opposite sides of the die pad respectively. Since both the first and second die are same die type and mounted faceup, the internal wirings within both dies are symmetrical and the bond pads on the first and second die are mirror symmetrical. Thereby it is not necessary to be subjected to a rewiring process. Therefore, it can simplify the multi-die package process, increase the density of package circuits, reduce the manufacture costs and enhance the performance of the circuits operation.

The multi-die semiconductor package structure according to the present invention comprises a lead frame and at least two dies, the lead frame comprises a die pad and a lead wire located at the periphery of the die pad, a first die and a second die are disposed on the opposite sides of the die pad respectively; other dies are stacked above the first die or the second die, and a base side of the second die is bound to the die pad; the die pad has a via hole at the edge thereof; a base opposite side of the first die is bound to the die pad; and the first die is electrically connected to the lead wire through the via hole.

Figure 1A:
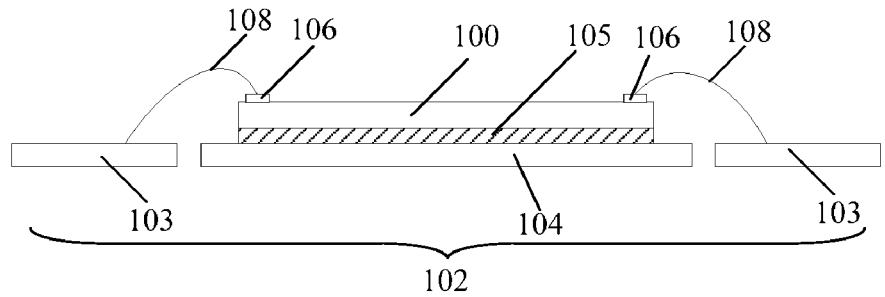
FIG. 1A to 1C illustrates schematic views of a multi-die semiconductor package structure according to the prior art.
Figure 1B:
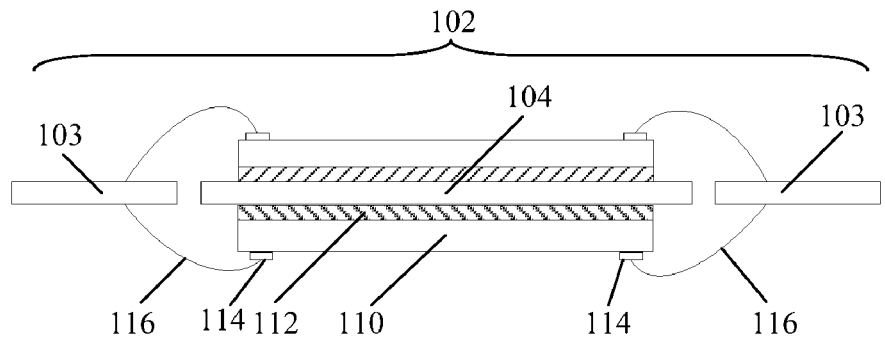
Figure 1C:
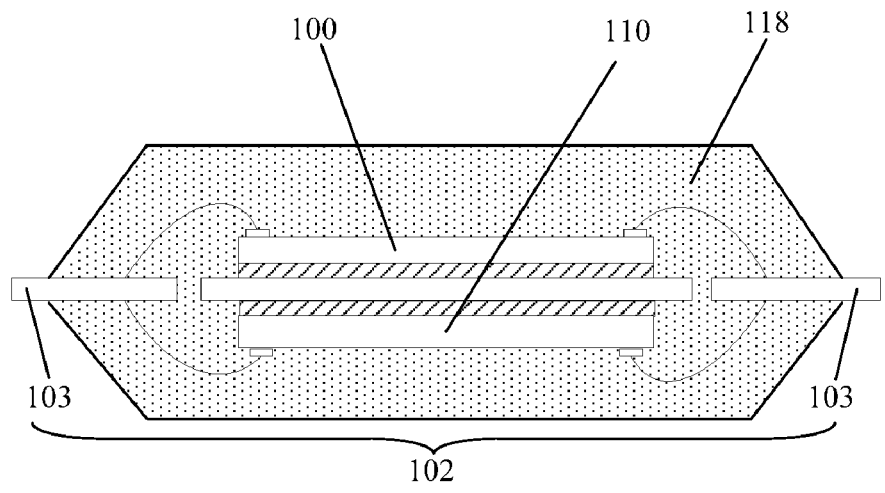
Figure 2:
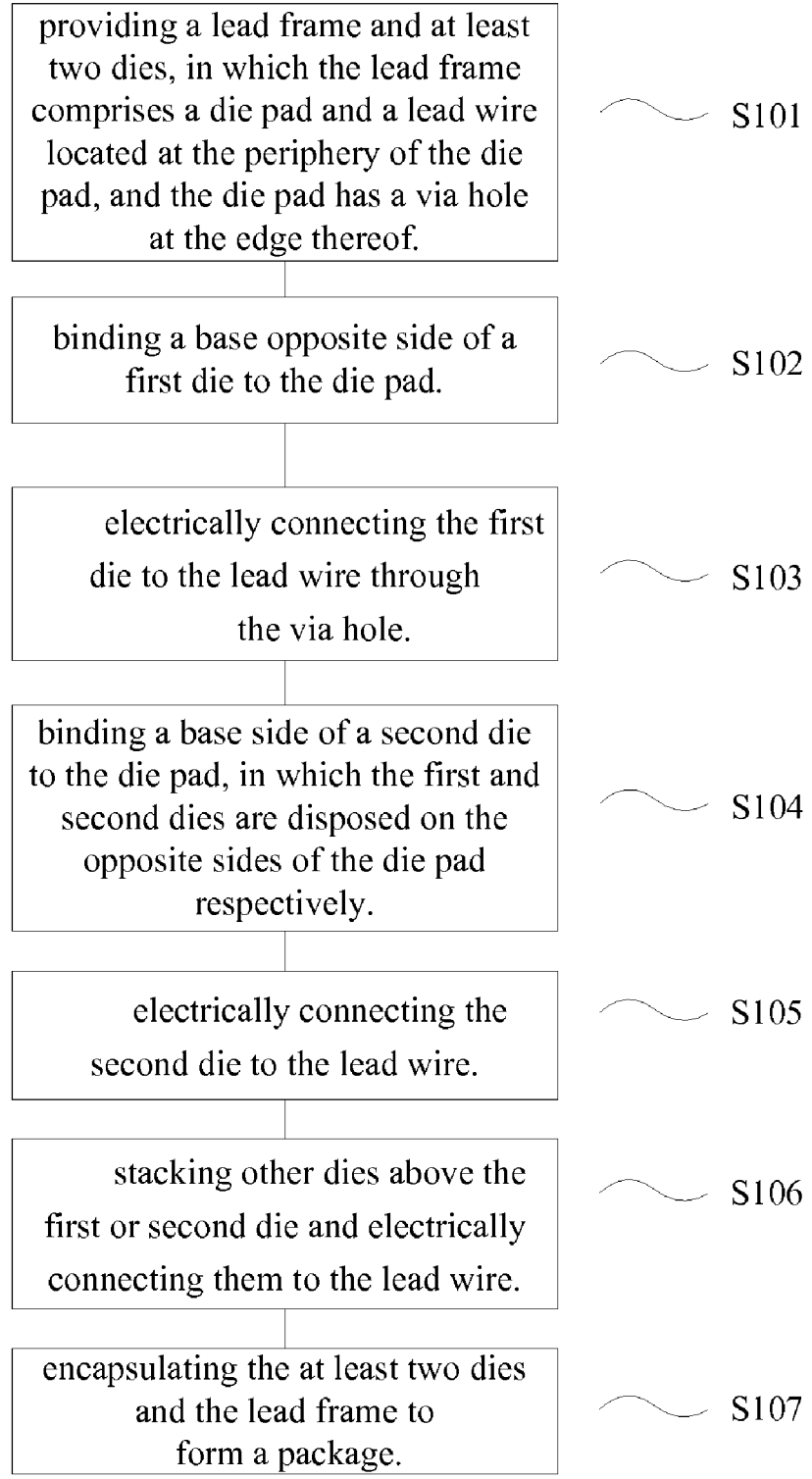
FIG. 2 illustrates a flow chart of a multi-die semiconductor package process according to the present invention.

FIG. 2 illustrates a flow chart of a multi-die semiconductor package process according to the present invention. As shown in FIG. 2, in step S101, a lead frame and at least two dies are provided, in which the lead frame comprises a die pad and a lead wire located at the periphery of the die pad, and the die pad has a via hole at the edge thereof. In step S102, a base opposite side of a first die is bound to the die pad. In step S103, the first die is electrically connected to the lead wire through the via hole. In step S104, a base side of a second die is bound to the die pad, in which the first and second die are disposed on the opposite sides of the die pad respectively. In step S105, the second die is electrically connected to the lead wire. In step S106, other dies are stacked above the first or second die and electrically connected to the lead wire. In step S107, said at least two dies and the lead frame are encapsulated to form a package.

Figure 3:
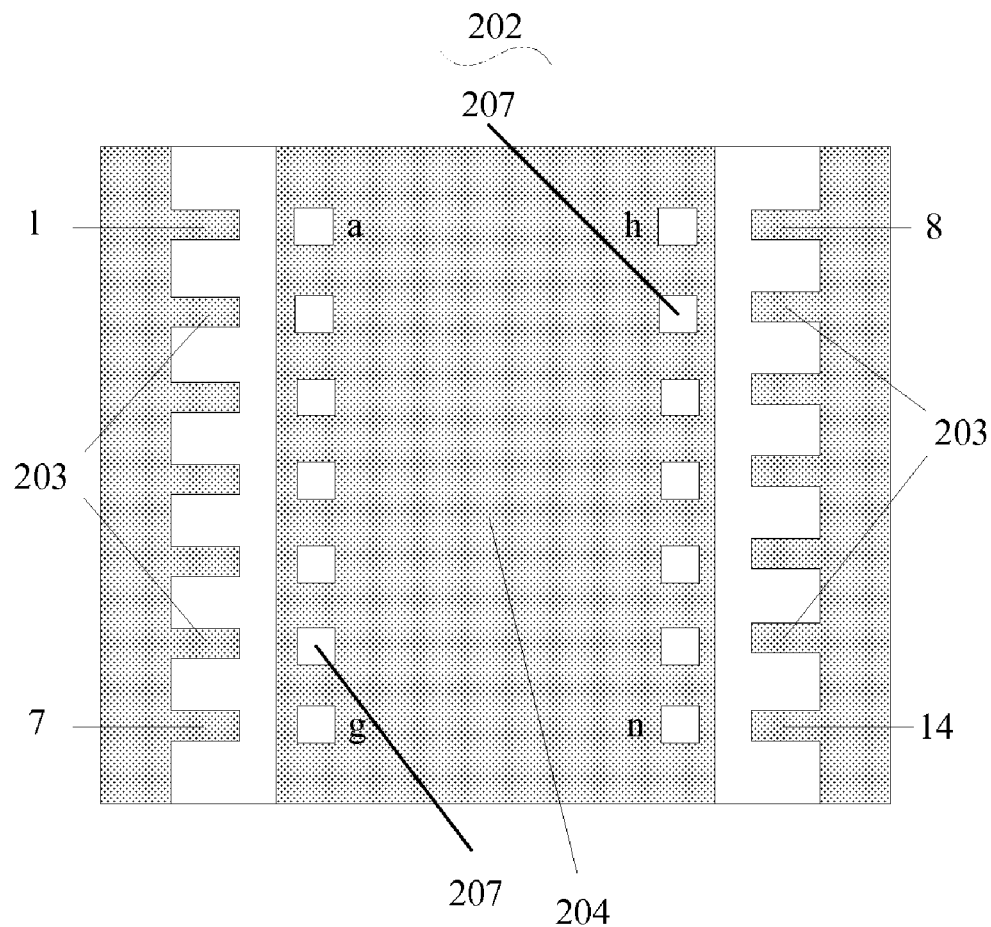
FIG. 3 illustrates a schematic view of a lead frame according to a first embodiment of the present invention.

FIG. 3 illustrates a schematic view of a lead frame according to a first embodiment of the present invention. As shown in FIG. 3, a lead frame 202 comprises a die pad 204 and a lead wire 203 located at the periphery of the die pad 204. The lead wire 203 is extended outward in a shape of comb and separated from the die pad 204. A plurality of closed via holes 207 in the same shape are disposed on the die pad 204, whose quantities and locations correspond to those of the lead wire 203. The closed via holes 207 are disposed on the edge of the die pad 204, in which the closed via hole designated with "a" corresponds to the lead wire designated by "1", . . . the closed via hole designated with "g" corresponds to the lead wire designated by "7". . . the closed via hole designated with "n" corresponds to the lead wire designated by "14", the rest may be deduced by analogy.

In the present embodiment, the lead frame 202 has a single layer structure and is made of nickel, aluminum, or a metal alloy containing at least two of copper, nickel and aluminum. In the present embodiment, the lead frame may be either a dual in-line package (DIP) type or a quad flatpack (QFP) type.

In the present embodiment, the closed via holes 207 is not connected to the lead wire 203, and may have the same size between each other. The number of the closed via holes 207 may correspond to that of the lead wire 203, or the number of the closed via holes 207 may be different from that of the lead wire 203. Several lead wires 203 may together pass through a single via hole 207, provided that the die pad 204 is not disconnected from the entire lead frame 202 due to the size of the closed via hole 207, and an area supporting a die is existed on the die pad 204.

The shape of the closed via hole 207 is a regular or irregular polygon, wherein the edge of the polygon is a straight line, arc, or the combination thereof. In this embodiment, the shape of the closed via hole 207 is a quadrangle, in particular is a square or rectangle. Besides the shapes above, the shape of the closed via hole 207 may also be a circularity, hemicycle, ellipse, half-ellipse, triangle, pentagon, hexagon, heptagon, octagon, nonagon, decagon, hendecagon, dodecagon, rounded triangle, rounded pentagon, rounded hexagon, rounded heptagon, rounded octagon, rounded nonagon, rounded decagon, rounded hendecagon or rounded dodecagon etc. Further, the shape of the closed via hole 207 may be different from each other. However, since the cross section of the metal wire which is connected to the lead wire through the closed via hole 207 is a circularity, preferably the shape of the closed via hole 207 is a circularity or ellipse in order to coincide with the shape of the metal wire.

Figure 3A:
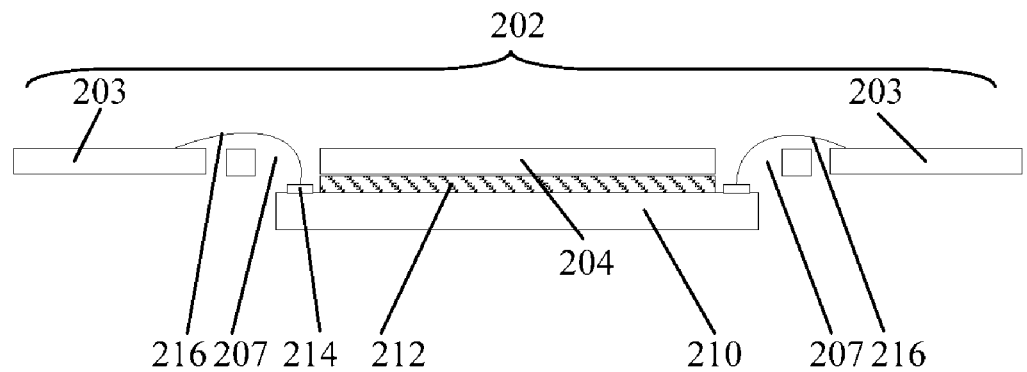
FIG. 3A to 3C illustrates schematic views of a multi-die semiconductor package structure according to a first embodiment of the present invention.
Figure 3B:
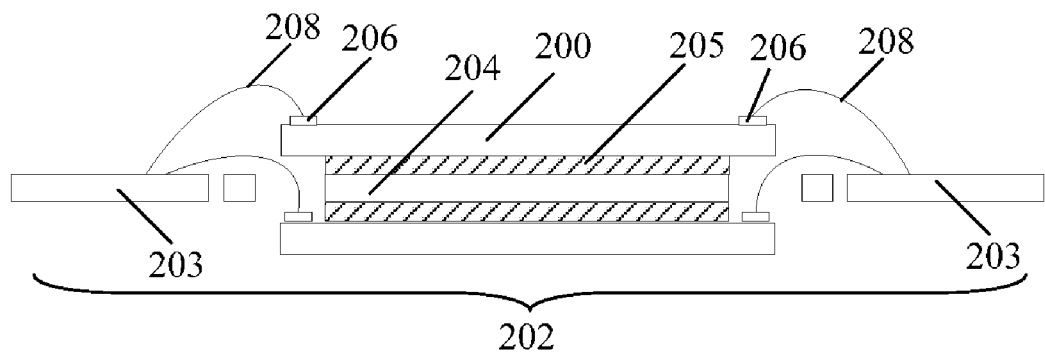
Figure 3C:
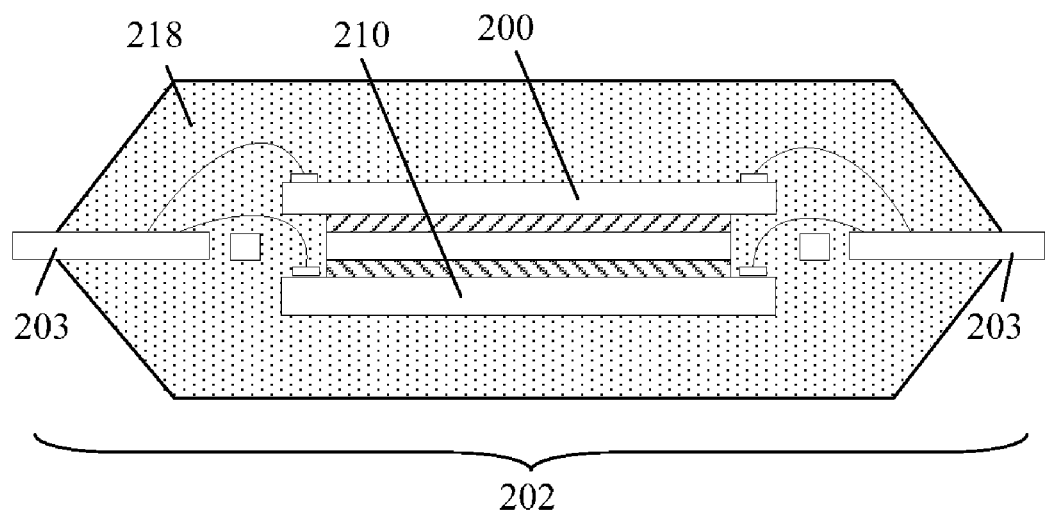

FIG. 3A to 3C illustrates schematic views of a multi-die semiconductor package structure according to a first embodiment of the present invention. As shown in FIG. 3A, a first die 210 with a first bond pad 214 thereon is disposed on a die pad 204 of a lead frame 202 as shown in FIG. 3, and then a first base opposite side of the first die 210 is bound to the die pad 204 through a first binder layer 212, wherein the side of the first die 210 provided with the first bond pad 214 thereon is the first base opposite side and the side opposite to the first base opposite side is the first base side. Next, the first bond pad 214 provided on the first die 210 is electrically connected to a lead wire 203 of the lead frame 202 in an one-to-one corresponding manner by a first bond wire 216 passing through a closed via hole 207 on the die pad 204.

In the present embodiment, the first binder layer 212 is an insulated spacer film which is made of an organic compound such as epoxy resin or polyimide.

The first bond pad 214 is made of a metal or an alloy, such as copper, aluminum, or copper-aluminum alloy.

The first bond wire 216 is made of gold, copper, aluminum, or copper-aluminum alloy.

As shown in FIG. 3B, a second die 200 with a second bond pad 206 thereon is arranged on the die pad 204 of the lead frame 202 on opposite side to the first die 210, and then a second base side of the second die 200 is bound to the die pad 204 through a second binder layer 205, wherein the side of the second die 200 provided with the second bond pad 206 thereon is the second base opposite side and the side opposite to the second base opposite side is the second base side. Next, the second bond pad 206 on the second die 200 is electrically connected to the lead wire 203 of the lead frame 202 by a second bond wire 208. Since the first die 210 and the second die 200 are the same die type and mounted faceup on the die pad 204 in the same way, so that the internal wirings within the first die 210 and the second die 200 are symmetrical. Thereby the locations are mirror symmetrical between the first bond pad 214 on the first die 210 and the second bond pad 206 on the second die 200, it is not necessary to be subjected to the rewiring process on the first die 210.

In the present embodiment, the second binder layer 205 is an insulated spacer film which is made of an organic compound such as epoxy resin or polyimide.

The second bond pad 206 is made of a metal or an alloy such as copper, aluminum, or copper-aluminum alloy.

The second bond wire 208 is made of gold, copper, aluminum, or copper-aluminum alloy.

As shown in FIG. 3C, the first die 210, the second die 200 and the lead frame 202 are finally encapsulated by a package paste 218, and only a portion of the lead wire 203 of the lead frame 202 is exposed.

In the present embodiment, two dies are disposed on the opposite sides of the lead frame respectively, and the side of one of the dies provided with a bond pad thereon is bound to the lead frame. Alternatively, there is only one die in the package structure and the side of the die provided with a bond pad thereon is bound to the lead frame and the bond pad on the die may be connected to the lead wire by a bond wire passing through the closed via hole on the lead frame, so as to omit the rewiring process on the die. Two dies can also be stacked on each side of the lead frame.

Further referring to FIG. 3A to 3C, the lead frame 202 comprises the die pad 204 and the lead wire 203 located at the periphery of the die pad 204, wherein the die pad 204 has the closed via hole 207 at the edge thereof. The first die 210 is disposed on the lead frame 202 and bound to the die pad 204 through the first binder layer 212, wherein the side bound to the die pad 204 is the first base opposite side. The first bond pad 214 is disposed on the base opposite side of the first die 210. The first bond wire 216 passes through the closed via hole 207 to electrically connect the first bond pad 214 to the lead wire 203. The second die 200 is disposed on the lead frame 202 on the opposite side to the first die 210 and bound to the die pad 204 through the second binder layer 205, wherein the side bound to the die pad 204 is the second base side. The second bond pad 206 is disposed on the base side of the second die 200. And the second bond pad 206 is electrically connected to the lead wire 203 by the second bond wire 208.

Figure 4:
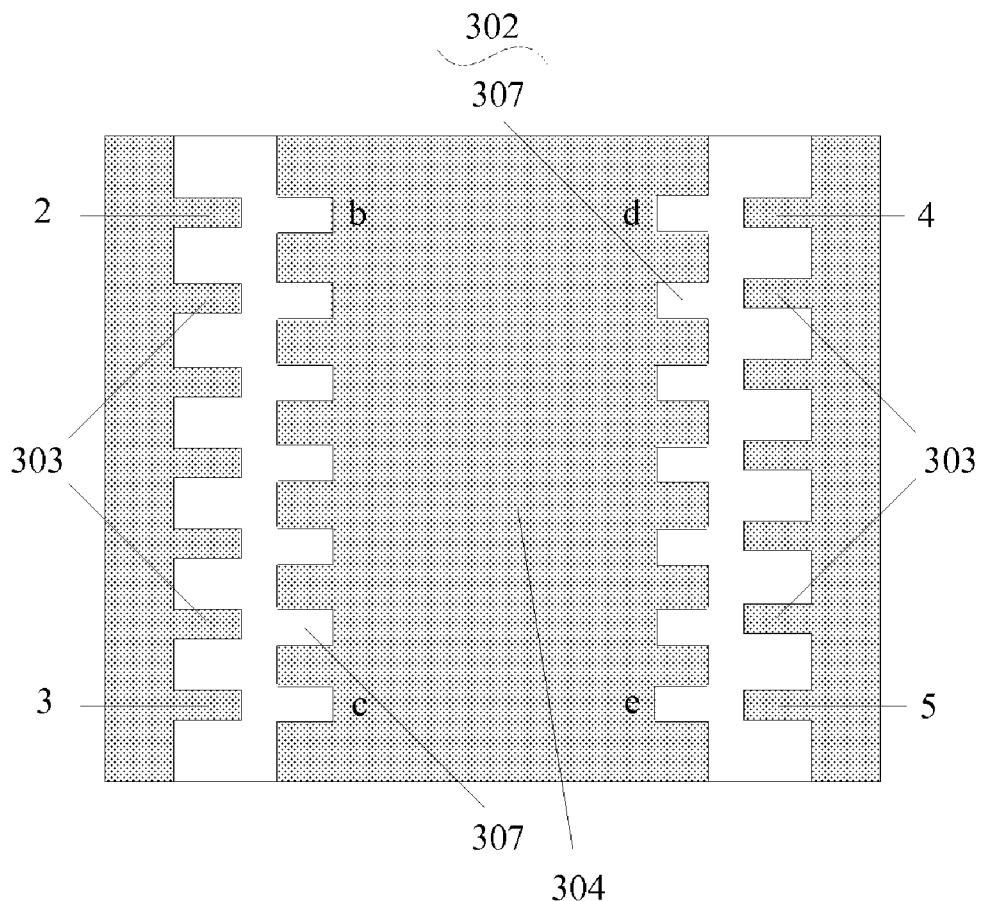
FIG. 4 illustrates a schematic view of a lead frame according to a second embodiment of the present invention.

FIG. 4 illustrates a schematic view of a lead frame according to a second embodiment of the present invention. As shown in FIG. 4, a lead frame 302 comprises a die pad 304 and a lead wire 303 located at the periphery of the die pad 304. The lead wire 303 is extended outward in the shape of comb and separated from the die pad 304. A plurality of opened via holes 307 in the same shape are disposed on the die pad 304, whose quantities and locations correspond to those of the lead wire 304. The opened via holes 307 are disposed at the edge of the die pad 304, in which the opened via hole designated with "b" corresponds to the lead wire designated by "2", the opened via hole designated with "c" corresponds to the lead wire designated by "3", the opened via hole designated with "d" corresponds to the lead wire designated by "4", and the opened via hole designated with "e" corresponds to the lead wire designated by "5".

In the present embodiment, the lead frame 302 has a single layer structure. The lead frame is made of copper, nickel, aluminum, or a metal alloy containing at least two of copper, nickel and aluminum.

In the present embodiment, the lead frame may be either a dual in-line package (DIP) type or a quad flatpack (QFP) type.

In the present embodiment, the opened via holes 307 is connected to the lead wire 303, and may have the same size between each other. The number of the opened via holes 307 may correspond to that of the lead wire 303, or the number of the opened via holes 307 may be different from that of the lead wire 303. Several lead wires 303 may together pass through a single via hole 307, provided that the die pad 304 is not disconnected from the entire lead frame 302 due to the size of the opened via holes 307, and an area supporting a die is existed on the die pad 304.

The shape of the opened via hole 307 is a regular or irregular polygon, wherein the edge of the polygon is a straight line, arc, or the combination thereof. In this embodiment, the shape of the opened via hole 307 is a quadrangle, in particular is a square or rectangle. Besides the shapes above, the shape of the opened via hole 307 may also be a circularity, hemicycle, ellipse, half-ellipse, triangle, pentagon, hexagon, heptagon, octagon, nonagon, decagon, hendecagon, dodecagon, rounded triangle, rounded pentagon, rounded hexagon, rounded heptagon, rounded octagon, rounded nonagon, rounded decagon, rounded hendecagon or rounded dodecagon etc. Further, the shape of the opened via hole 307 may be different from each other. However, since the cross section of the metal wire which is connected to the lead wire through the opened via hole 307 is a circularity, preferably the shape of the opened via hole 307 is a circularity or ellipse in order to coincide with the shape of the metal wire.

Figure 4A:
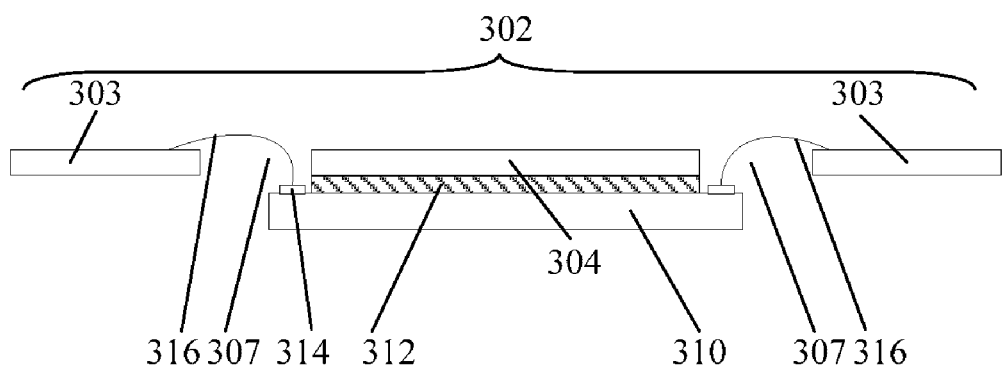
FIG. 4A to 4C illustrates schematic views of a multi-die semiconductor package structure according to a second embodiment of the present invention.
Figure 4B:
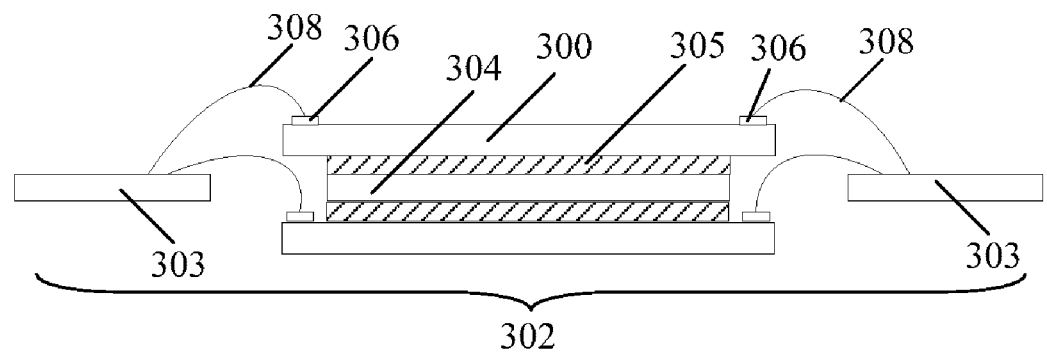
Figure 4C:
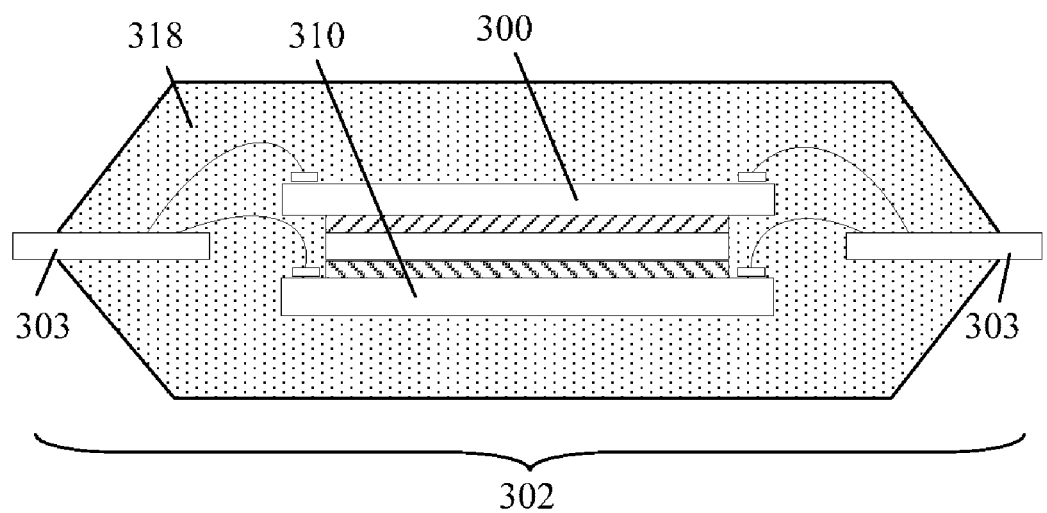

FIG. 4A to 4C illustrates schematic views of a stacked multi-die semiconductor package structure according to a second embodiment of the present invention. As shown in FIG. 4A, a first die 310 with a first bond pad 314 thereon is disposed on a die pad 304 of a lead frame 302 as shown in FIG. 4, and then a first base opposite side of the first die 310 is bound to the die pad 304 through a first binder layer 312, wherein the side of the first die 310 provided with the first bond pad 314 thereon is the first base opposite side and the side opposite to the first base opposite side is the first base side. Next, the first bond pad 314 provided on the first die 310 is electrically connected to a lead wire 303 of the lead frame 302 in an one-to-one corresponding manner by a first bond wire 316 passing through an opened via hole 307 on the die pad 304.

In the present embodiment, the first binder layer 312 is an insulated spacer film which is made of an organic compound such as epoxy resin or polyimide.

The first bond pad 314 is made of a metal or an alloy, such as copper, aluminum, or copper-aluminum alloy.

The first bond wire 316 is made of gold, copper, aluminum, or copper-aluminum alloy.

As shown in FIG. 4B, a second die 300 with a second bond pad 306 thereon is arranged on the die pad 304 of the lead frame 302 on opposite side to the first die 310, and then a second base side of the second die 300 is bound to the die pad 304 through a second binder layer 305, wherein the side of the second die 300 provided with the second bond pad 306 thereon is the second base opposite side and the side opposite to the second base opposite side is the second base side. Next, the second bond pad 306 on the second die 300 is electrically connected to the lead wire 303 of the lead frame 302 by a second bond wire 308. Since the first die 310 and the second die 300 are the same die type and mounted faceup on the die pad 304 in the same way, so that the internal wirings within the first die 310 and the second die 300 are symmetrical. Thereby the locations are mirror symmetrical between the first bond pad 314 on the first die 310 and the second bond pad 306 on the second die 300, it is not necessary to be subjected to the rewiring process on the first die 310.

In the present embodiment, the second binder layer 305 is an insulated spacer film which is made of an organic compound such as epoxy resin or polyimide.

The second bond pad 306 is made of a metal or an alloy, such as copper, aluminum, or copper-aluminum alloy.

The second bond wire 308 is made of gold, copper, aluminum, or copper-aluminum alloy.

As shown in FIG. 4C, the first die 310, the second die 300 and the lead frame 302 are finally encapsulated by a package paste 318, and only a portion of the lead wire 303 of lead frame 302 is exposed.

In the present embodiment, two dies are disposed on the opposite sides of the lead frame respectively, and the side of one of the dies provided with a bond pad thereon is bound to the lead frame. Alternatively, there is only one die in the package structure and the side of the die provided with a bond pad thereon is bound to the lead frame and the bond pad on the die may be connected to the lead wire by a bond wire passing through the opened via hole on the lead frame, so as to omit the rewiring process on the die. Two dies can also be stacked on each side of the lead frame.

Further referring to FIG. 4A to 4C, the lead frame 302 comprises the die pad 304 and the lead wire 303 located at the periphery of the die pad 304, wherein the die pad 304 has the opened via hole 307 at the edge thereof. The first die 310 is disposed on the lead frame 302 and bound to the die pad 304 through the first binder layer 312, wherein the side bound to the die pad 304 is the first base opposite side. The first bond pad 314 is disposed on the base opposite side of the first die 310. The first bond wire 316 passes through the opened via hole 307 to electrically connect the first bond pad 314 to the lead wire 303. The second die 300 is disposed on the lead frame 302 on the opposite side to the first die 310 and bound to the die pad 304 through the second binder layer 305, wherein the side bound to the die pad 304 is the second base side. The second bond pad 306 is disposed on the base side of the second die 300. And the second bond pad 306 is electrically connected to the lead wire 303 by the second bond wire 308.

While the present invention has been described with respect to specific embodiments, it will be apparent to those skilled in the art that various changes and modifications may be made without departing from the spirit and scope of the invention as defined in the following claims.

What is claimed is:

1. A method for packaging a multi-die semiconductor, comprising:
   providing at least first and second dies and a lead frame comprising a die pad and a lead wire located at the periphery of the die pad, the die pad has a via hole at the edge thereof;
   binding a base opposite side of the first die to the die pad;
   electrically connecting the first die to the lead wire through the via hole;
   binding a base side of the second die to the die pad, the first and second dies are disposed on the opposite sides of the die pad respectively;
   electrically connecting the second die to the lead wire; and
   encapsulating said at least first and second dies and the lead frame to form a package.

2. The method for packaging a multi-die semiconductor according to claim 1, wherein the side of the via hole towards the lead wire is closed.

3. The method for packaging a multi-die semiconductor according to claim 1, wherein the first die is electrically connected to the lead wire using a bond wire passing through the via hole.

4. The method for packaging a multi-die semiconductor according to claim 1, wherein the shape of the via hole is a regular or irregular polygon.

5. The method for packaging a multi-die semiconductor according to claim 4, wherein the edge of the polygon is a straight line, arc, or the combination thereof.

6. The method for packaging a multi-die semiconductor according to claim 1, wherein the base opposite side of the first die and the base side of the second die are bound to the die pad using an insulated spacer film.

7. The method for packaging a multi-die semiconductor according to claim 1, wherein the lead frame is made of copper, nickel, aluminum, or a metal alloy containing at least two of copper, nickel and aluminum.

* * * * *